(12) United States Patent
Wan

(10) Patent No.: US 7,005,775 B2
(45) Date of Patent: Feb. 28, 2006

(54) MICROFABRICATED TORSIONAL DRIVE UTILIZING LATERAL ELECTROSTATIC FORCE

(76) Inventor: Chang Feng Wan, 16210 Shadybank Dr., Dallas, TX (US) 75248

( * ) Notice: Subject to any disclaimer, the term of this patent is extended or adjusted under 35 U.S.C. 154(b) by 494 days.

(21) Appl. No.: 10/142,821

(22) Filed: May 9, 2002

(65) Prior Publication Data

US 2005/0002084 A1   Jan. 6, 2005

Related U.S. Application Data

(60) Provisional application No. 60/289,863, filed on May 9, 2001.

(51) Int. Cl.
*H02N 1/00* (2006.01)
*G02B 26/08* (2006.01)

(52) U.S. Cl. ............... 310/309; 359/291; 359/223; 359/224

(58) Field of Classification Search ........ 310/309; 318/116; 385/18; 359/291, 223, 224, 225, 359/226
See application file for complete search history.

(56) References Cited

U.S. PATENT DOCUMENTS

| | | | | | |
|---|---|---|---|---|---|
| 4,922,756 | A | * | 5/1990 | Henrion | 73/514.18 |
| 5,756,901 | A | * | 5/1998 | Kurle et al. | 73/777 |
| 6,000,280 | A | * | 12/1999 | Miller et al. | 73/105 |
| 6,135,423 | A | * | 10/2000 | Johnson | 256/1 |
| 6,629,461 | B1 | * | 10/2003 | Behin et al. | 73/514.16 |
| 2005/0002084 | A1 | * | 1/2005 | Wan | 359/291 |

FOREIGN PATENT DOCUMENTS

JP         2000-147419    * 5/2000

OTHER PUBLICATIONS

English translation of 2000-147419. May 2000, Izeki et al.*

* cited by examiner

*Primary Examiner*—Karl Tamai

(57) ABSTRACT

The present invention is related to a novel micro-electro-mechanical systems (MEMS) torsional drive that is capable of tilting suspended structure such as a micro-mirror for steering light beams in three-dimensional analog fashion, which is suitable for high port count optical switches. The torsional drive has the advantages of allowing large tilt angle, having low drive voltage, and capable of providing a feedback signal for closed-loop control.

3 Claims, 10 Drawing Sheets

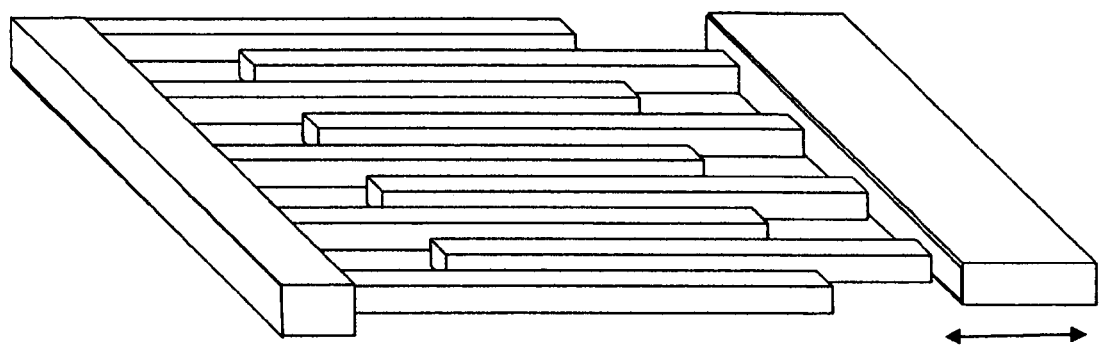
Fig. 1a      -- Prior Art --
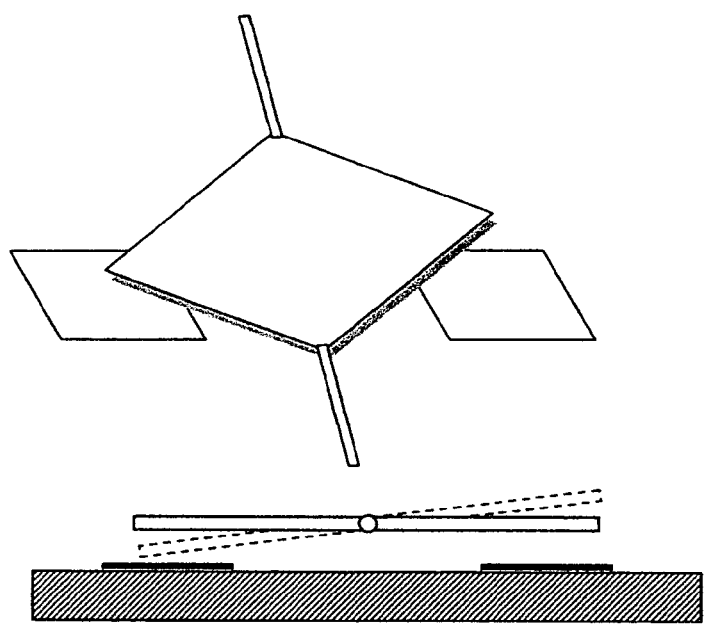
Fig. 1b      -- Prior Art --

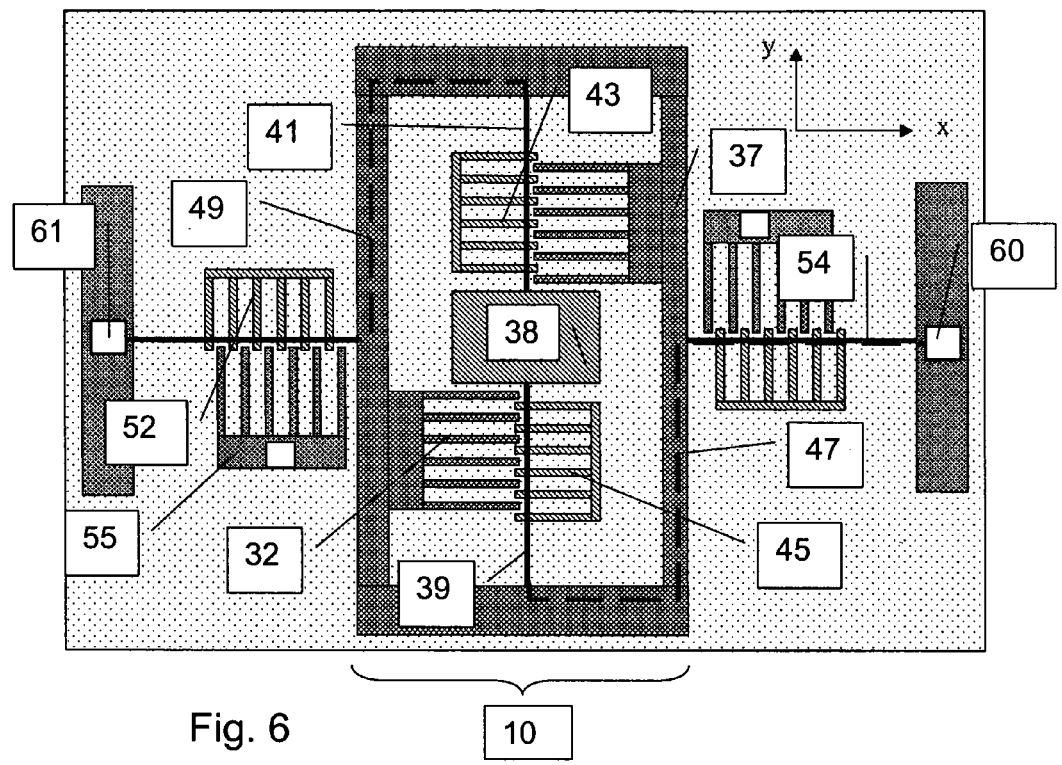
Fig. 6
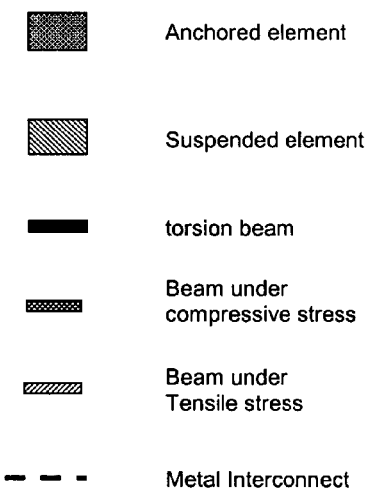
Fig. 7a
Fig. 7b
| | |
|---|---|
| ▓ | Anchored element |
| ▨ | Suspended element |
| ▬ | torsion beam |
| ▰ | Beam under compressive stress |
| ▨ | Beam under Tensile stress |
| - - - | Metal Interconnect |

MICROFABRICATED TORSIONAL DRIVE UTILIZING LATERAL ELECTROSTATIC FORCE

CROSS REFERENCE TO RELATED APPLICATION

This application claims the benefit of the filing date of the provisional application Ser. No. 60/289,863, filed May 9, 2001.

BACKGROUND OF THE INVENTION

1. Technical Field of the Invention

The present invention is related to a novel micro-electro-mechanical systems (MEMS) torsional drive that is capable of tilting suspended structure such as a micro-mirror for steering light beams in three-dimensional analog fashion, which is suitable for high port count optical switches.

2. Description of the Related Art

Commercial MEMS-based all-optical switches are based on one fundamental principle and two well-understood approaches. The principle is simple: The switch routes photons from one fiber-optic cable to another. The routing is accomplished by steering the light through a collimating lens, reflecting it off a movable mirror, and redirecting the light back into one of N possible output ports. The two basic design approaches for translating this principle into optical switches are a two-dimensional (2-D) or digital approach (N2 architecture) and a three-dimensional (3-D) or analog approach (2N architecture).

The 2-D digital approach is so-called because the micro-mirrors and fibers are arranged in a planar fashion, and the mirrors can only be in either of two known positions (on or off) at any given time. In this approach, an array of MEMS micro-mirrors is used to connect N input fibers to N output fibers. This is called an N2 architecture, because it uses N2 individual mirrors. It is the optical equivalent of a cross-bar switch. For example, an 8×8 2-D switch uses 64 mirrors. A big advantage of this approach is that it requires only simple controls, essentially consisting of very simple, transistor-transistor-logic (TTL) drivers and associated electronic upconverters to provide the required voltage levels at each MEMS micro-mirror. Apart from a robust product line of N×N switches, including 4×4, 8×8, 16×16, and 32×32 ports, which use an input and an output fiber port, the 2-D planar approach supports the introduction of a third and fourth fiber port to a basic N×N switch. That permits dynamic add/drop functionality, arrays of 1×N switches in a single package, and customized mirror configurations on the chip. These features allow an array of mirrors to replace yesterday's cumbersome, expensive, custom discrete switch integrations with small, hermetically packaged, robust, custom switching configurations. Although the simple 2-D design is inherently flexible, the greatest challenge in this approach lies in scaling switching to very high port counts. As port count doubles, the distance the light must travel through free space is also doubled, and the diameter of the light beam grows, placing tighter constraints on collimator performance and mirror-alignment tolerance. Because of the length of the travel path for the signal, as well as the angle tolerance and angle uniformity required on the MEMS mirror itself, 32 ports are currently considered by most vendors a top-end size for a single-chip solution in 2-D technology. This is not to say that a 2-D approach is limited to 32 ports. On the contrary, there are architectures, including the well-known Clos approach that cascades smaller 2-D switches into a multistage architecture scalable to hundreds by hundreds of ports. An example is Siemens's Transexpress MODIF optical service node. Another benefit of the 2-D approach is the ability to move rapidly from development to high-volume manufacturing, while maintaining the optical performance of a hand-built component, coupled with the reliability and cost-effectiveness of a mass-produced product.

In many respects, the 3-D analog or beam-steering approach is actually very similar to the 2-D approach. It uses the same principle of moving a mirror to redirect light. The 3-D approach results in a 2N architecture, because two arrays of N mirrors each are used to connect N input to N output fibers. But in this approach, each mirror has multiple possible positions—at least N positions. This approach is much less constrained by the scaling distance of light propagation as the port count grows. Such architectures can scale to thousands by thousands of ports with low loss (potentially 6 dB or less) and high uniformity. These advantages come at a price, however, because the micro-mirror must have multiple possible positions, a sophisticated analog-driving scheme is implemented to ensure that the mirrors are in the correct positions at all times. Although MEMS technology can produce 2N 3-D mirror arrays with impressive stability and repeatability by using a simple open-loop driving scheme, closing the loop with active feedback controls is fundamental to achieving the long-term stability required in carrier-class deployment of an all-optical cross-connect. Using a closed-loop control scheme implies that monitoring the beam positions must be implemented in conjunction with computation resources for the active feedback loop and very-linear high-voltage drivers.

The MEMS technology that is used by most optical switch vendors is polysilicon-based surface micromachining technology, due to its demonstrated capability to fabricate sophisticated micromachines that optical devices tend to be. As mentioned before, this technology requires also expensive capital equipment and infracture that only a few large companies can afford. Most vendors developing MEMS-based switches typically outsource the manufacture of the actual structure to a foundry and focus their efforts on creating the subsystem in which they fit. However, after a few years of intense effort in optical switches development, it becomes clear that polysilicon is not a good choice for optical switches due to its inconsistent properties such as intrinsic residual stress that are detrimental to optical structures. Thus port count in 2D arrays is limited to 32×32 (OMM white paper), and high-volume production of such switches has not been established or demonstrated. More and more vendors are moving to single crystal material in developing their mirrors for optical switches, including Lucent technologies, Inc., Calient Networks, IMMI, and Texas Instruments using bulk micromachining technologies, in part or as a whole. These mirrors have less tendency to warp and are easier to make. However, they have not reached sophistication level and manufacturability that have been demonstrated with surface micromachining technology. They also tend to be large which makes it more difficult to grow the port count.

A useful cross-connect switch fabric should handle up to 1280 cross-connect (XC) channels (ports) at up to 3.2 Terabits/sec total capacity. It should be strictly non-blocking, growable to large size (>1024×1024), and polarization independent, should have <5 dB insertion loss, <1 ms switch time, wavelength independent, and <40 dB cross talk, and it must be manufactured at a low cost.

Although tilting micro-mirrors fabricated by micromachining techniques is an obvious candidate for making XC fabric due to their advantages in cross-talk, polarization- and wavelength-independence and bit-rate transparency, which prompted many companies to adopt this technique, implementing them in large array format is met with obstacles. The low insertion loss requirement is more difficult to meet for larger switches because it increases rapidly with the distance of light path, which is directly proportional to size of a MEMS optical switch. Such loss can be introduced by mirror angle divergence from 90 degrees, mirror angle uniformity across the array and travel distance variations along non-uniform path lengths, warp in the mirrors and/or support frames, Gaussian beam propagation, and divergence due to the collimating lenses.

Thus MEMS vendors have difficulties in growing the 2D arrays much larger than 32×32 ports as reported by OMM, who is resorting to the 3D architecture for larger switches, which shifts the task of aligning the light beam from simple digital setting to a subsystem that each mirror is controlled by analog circuits with closed-loop feedback, and multiple LEDs and detectors. Such subsystems are very complex and bulky, if a 72×72 switch developed by by Astarte, Inc. (recently acquired by Tellium), which measured 2 meters on a side, is an indication.

However, the polysilicon-based micromachining technology, because their actuators are made very large, compared to the size of the mirrors, for overcoming restorative force of the springs on the mirrors, improve switching speed to below 1 ms, and reduce yield loss due to poor optical alignment, thin film stress, and defects. Thus larger size switch is resorting to "3D" steerable mirror arrays, which was demonstrated by Lucent in 1992, but has not been shown to be production worthy. This type of optical switch, although requires much fewer micro-mirrors, are relatively large and difficult to make and assemble, its switching speed is slowed, and the cross connects are not non-blocking, which increases cost of ownership at the system or subsystem level.

As the port count grows, it becomes more and more difficult to route conductive lines from the edges of the chip to the center switches. A 32×32 array requires at least 16 conductive lines to run through at least one of the edge switches. This increases the chip size significantly and can become a limiting factor in growing the port count. This is even more challenging in the case of 3D arrays where every mirror has a control circuit with closed-loop feedback.

An important issue that most optical switch vendors have failed to address is the integration of electrical circuitry that drives or actuates the tilt of the micromirrors. This lack of integration strategy stems from the fact that the lateral, side-by-side integration of microcircuits used in actuators system-on-a-chip approach to optical switches where integration of mirror-controlling circuitry or even microprocessors are integrated on the same MEMS chip.

Micromachined optical switches use tilting or movable mirrors to direct light beams. The mirrors are manipulated with attached microactuators to initiate and control the movement. Perhaps the most popular microactuator is so called comb drive (FIG. 1a), which consists of a movable comb and a fixed comb as shown in FIG. 1. When a voltage is applied between the two combs, the movable comb is attracted to the fixed comb. The position of the movable comb is thus be controlled by the voltage. The comb drive, like most others, produce lateral displacement instead of rotational displacement or torque. Two actuators are reported in the literature that produces rotational movement. First one is a parallel plate actuator (FIG. 1b), which simply places two electrodes under two sides of a hinged metal plate and applies a voltage on the electrodes to tilt the hinged metal plate. A modification of this actuator uses electromagnets to provide the torsional force. A second torsional actuator (J. A. Yeh, et. al. J. Microelectromechanical systems, Vol. 8 (4), 456–465, 1999) consists of hinged polysilicon comb and bulk silicon comb to form an asymmetric combdrive where the polysilicon comb is offset from the bulk silicon comb.

The polysilicon comb is attracted to the bulk silicon comb with applied voltage by fringe field, which generates a force that is very weak at the beginning and increases rapidly when the gap closes until the two combs merge, at which point the torque diminishes. The amount of tilt is proportional to the thickness of the polysilicon layer, which is quite small. Thus the drive was combined with the parallel plate torsional actuator to provide larger tilt. Even so, the amount of tilt is limited to less than 10 degrees and the voltage required is large, more than 50 volts. Such voltage is too high for regular CMOS integrated circuits to provide, thus a discrete driver has to be used.

SUMMARY OF THE INVENTION

It is one objective of the present invention to provide a low voltage torsional electrostatic drive that is capable of tilting a suspended structure of a micromachined device with large angles using low voltages.

It is another object of the present invention to provide a micromachined optical switch having integrated drivers that has a large array of micro-mirrors and is capable of steering a multitude of light beams in both x and y directions.

It is yet another objective of the present invention to improve a method of manufacture micro-electro-mechanical device that employ dual axis torsional drives.

The torsional drive comprises a fixed comb with multiple parallel plates that interdigits with a movable comb with an axis of rotation. When a voltage is applied between the two combs, electrostatic force is generated to rotate the movable comb so that the capacitance between them is reduced.

The optical switch comprises a plurality of said torsional drives that tilts micro-mirrors in both x and y directions. A stressed film can be deposited on the torsion beam hinges to extend the range of the tilt.

BRIEF DESCRIPTION OF THE DRAWINGS

The novel features believed characteristic of this invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

FIG. 1a is schematic view of a typical comb drive that provides lateral force or movement.

FIG. 1b is schematic view of a typical torsion mirror that employs parallel plate capacitors to tilt the mirror.

FIG. 6 is a top schematic view of a dual-axis micromachined optical switch according to yet another embodiment of the present invention.

FIG. 7a shows two films having compressive and tensile stress, respectively, are deposited on alternating run segments of a meandering torsion beam, resulting in a bending pattern shown in FIG. 7b. A single film having either compressive or tensile stress can be used also to achieve similar result.

FIG. 7b is top schematic view of an alternative embodiment of a micromachined hinge.

FIG. 8b is section schematic view of the micromachined optical switch in FIG. 8a.

DETAILED DESCRIPTION OF PREFERRED EMBODIMENT

Figure 2:
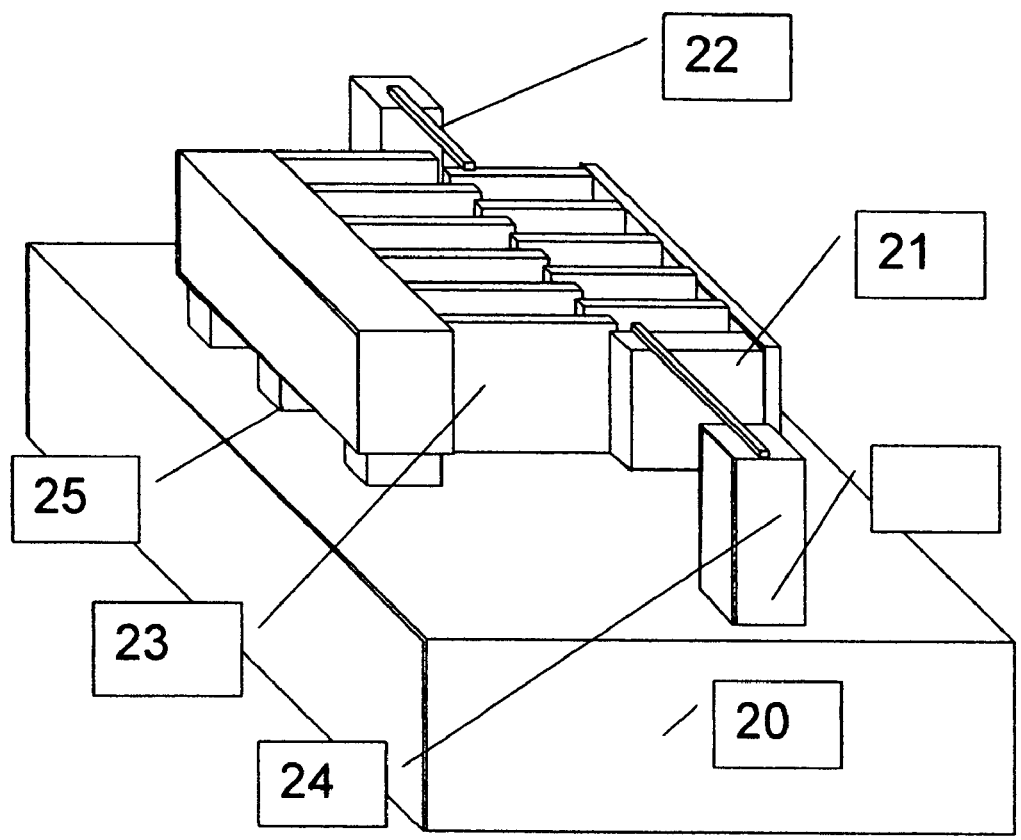
FIG. 2 is schematic view of a micromachined torsional drive according to the first embodiment of the present invention.

Our novel electrostatic torsional drive resembles a regular electrostatic combdrive, but a major difference is that the combs are made from thick single crystal silicon layer and the movable comb is attached to torsion beams instead of flexure beams, making it rotatable. As shown in FIG. 2, the torsional drive comprises a fixed comb 23, a movable comb 21, torsion beams 22, two posts 24, a substrate 20, and pedestals 25. Movable comb 23 are hinged on torsion beams 22, which in turn are hinged on posts 24. The pedestals 25 anchor and adhere fixed combs 23 and posts 24 to substrate 20. The pedestals are made of epoxy sacrificial layer that is used to bond the thick single crystal silicon layer to the substrate and subsequently partially undercut. In another embodiment, the pedestals 25 are made of metal solder joint, which also make electrical connection to the substrate. In yet another embodiment, the pedestals 25 are made of metal layer deposited in via holes that are etched in said thick doped silicon and said sacrificial layer, which also make electrical connection to the substrate. The fixed comb 23, movable comb 21, and posts 24 are made from thick doped silicon, while the torsion beams are made of doped polycrystalline silicon. The torsion beams are in electrical contact with the movable beams.

Figure 3:
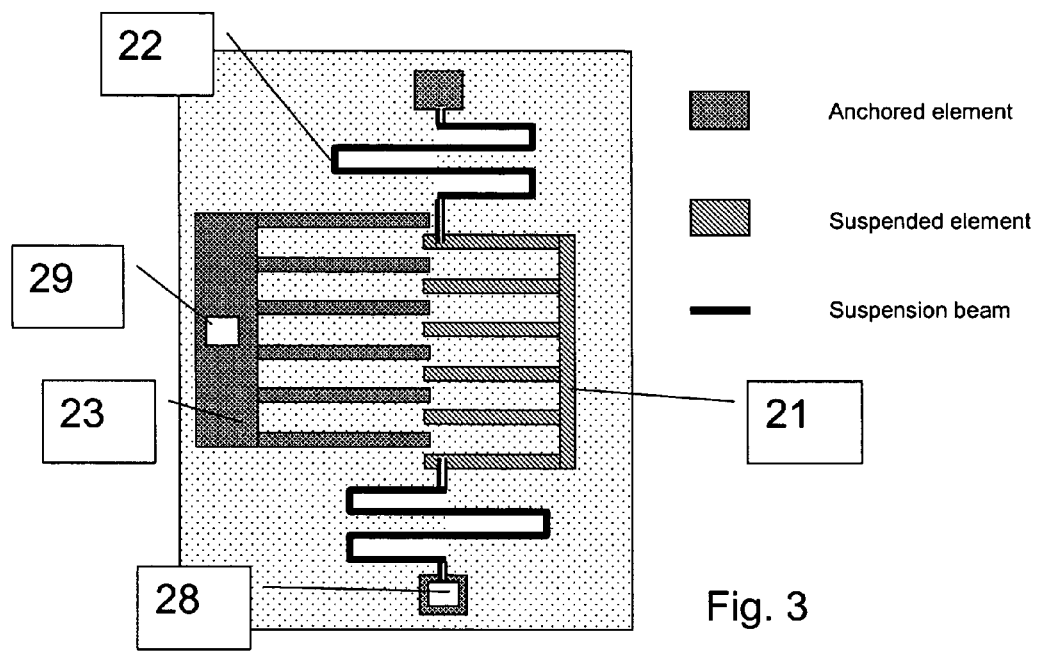
FIG. 3 is a top schematic view of the micromachined torsional drive in FIG. 2.
Figure 4A:
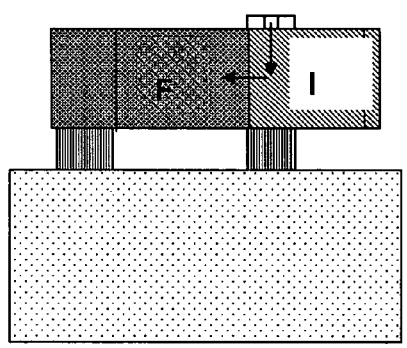
FIG. 4a is side schematic view of the micromachined torsional drive in FIG. 2.
Figure 4B:
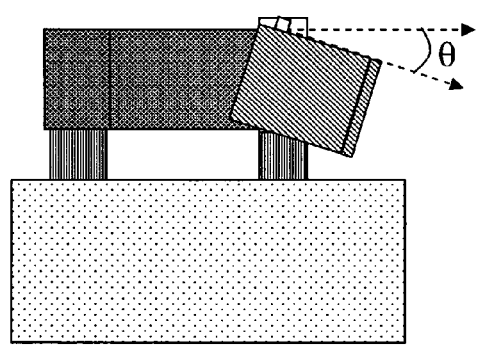
FIG. 4b is same view of the micromachined torsional drive in FIG. 4a, except the movable comb is tilted by an angle q after a voltage is applied between the two combs.

FIG. 3 is a top view of the torsional drive, which show the fixed comb and the movable comb interdigit slightly, but not in direct contact with each other. They are connected to two different electrical contacts 28. The torsion beams 22 can be a straight slender beam as shown in FIG. 2, or can be folded into meandering shape, as shown in FIG. 3. The torsion beam hinge 22 is an electrical conductor, preferably made of polycrystalline silicon, which make electrical contact to both the movable comb and the post 25. The folded beam hinge is more compact and requires less torque to twist, thus is the preferred hinge design choice. When a voltage is applied across the fixed comb and the movable comb through contacts 28 and 29, an attractive electrostatic force is generated as is represented by vector F, as shown in cross sectional side view of the torsional drive (FIG. 4a), where F is the combined force vector of the electrostatic force. This force creates an initial torque that is equal to the vector product of the force F and position vector I of the point where the force vector F is located. The origin of the position vector I is at the center of the torsion beam 22, After the movable comb is tilted an angle q (FIG. 4b) around the torsion beam, the magnitude of the torque can be calculated with the following equation:

$$t = (V^2/2) \cdot \partial C / \partial q$$

where t is the torque, C is the total capacitance of between the combs due to overlap of their plates or (teeth), V is applied bias voltage between the combs.

It can be seen that both the force vector F and the position vector I are proportional to the thickness of the combs. Thus, the torque is proportional to the square of the thickness of the combs. In the preferred embodiment, both combs are made by etching deep trenches in a thick layer of single crystal silicon. Thickness of the silicon is from 40 to 200 mm. This torsional drive provides much larger torque at lower voltages and larger turning angle than the parallel plate type. This is because the electrostatic force decreases as square of the inter-plate gap, thus must be kept small, which limits the turning angle. The torque from the present torsional drive is not limited by the gap between the combs and the substrate, thus the gap can be made large, allowing a large turning angle. Similar to comb drives, the electrostatic force provided by the present torsional drive is proportional to the number of teeth plates on the combs and inversely proportional to their spacing. This allows one to reduce operating voltage to less than 20V, which is compatible with integrated CMOS. Thus, the mirror array can have integrated CMOS to accomplish system-on-a-chip architecture. Capacitance between the movable combs and the fixed combs is large and is approximately proportional to the tilt angle, thus can be monitored and used as feedback for closed loop control of the tilt of the mirror.

Figure 5:
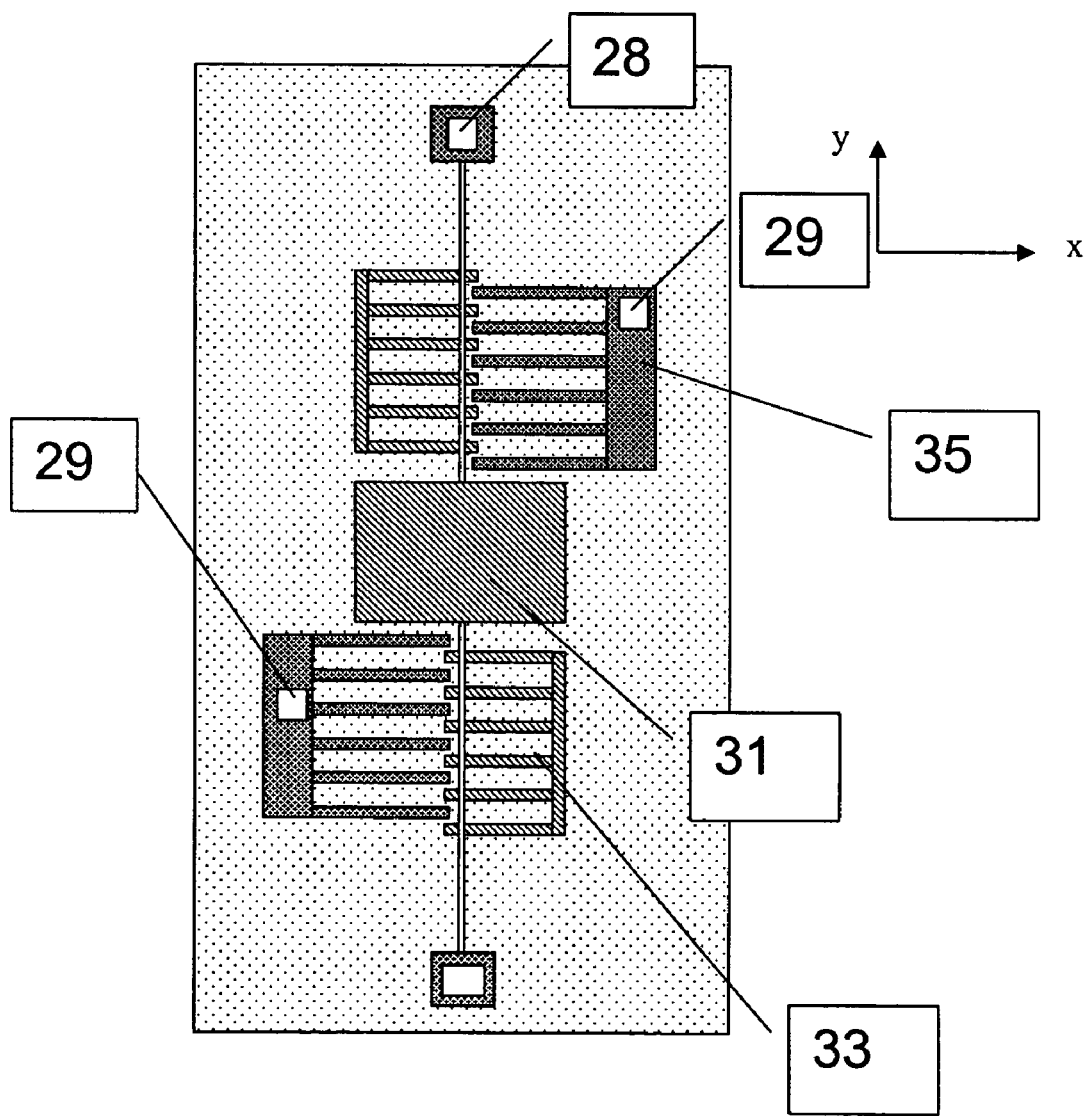
FIG. 5 is a top schematic view of a single-axis micromachined optical switch according to another embodiment of the present invention.

FIG. 5 shows a mirror 31 having two torsional drives and a payload plate 31, which forms a mirror. The two torsional drives tilt the mirror in clockwise or counter clockwise directions around y-axis depending on which torsoinal drive is being biased with the voltage. The mirror and the movable combs are grounded electrically. Note that a single torsion beam is now used for each drive, instead of two shown in FIGS. 2 and 3. FIG. 6 shows two additional torsional drives are attached to the mirror for tilting it around the x-axis. This configuration allows the mirror to steer a light beam in both x and y directions, enabling the mirror to form the 3-D configuration. In this embodiment, the mirror shown in FIG. 5 along with its torsional drives are anchored to a suspended frame 37 instead of a substrate. As shown in FIG. 6, they form an assembly 10 that is suspended and has two torsional drives attached on the sides in the same configuration as in FIG. 5, to enable the assembly 10 to be tilted by applying a voltage on fixed combs 55. In this embodiment, the suspended frame 37, inner fixed combs 32, outer hinges 54, and outer movable comb 52 are electrically grounded and a layer of insulator is deposited on them so that they are insulated from electrically conductive lines 47 and 49 and bond pads 60 and 61 that are formed on them, without electrical shorts. The torsion beams 39 and 41 are electrically insulated from the suspended frame 37 and the mirror 38 but are electrically connected to movable combs 43 and 45, respectively. Thin metal lines 47 and 49 make electrical connections between the torsion beam hinges 39 and 41 and bond pads 60 and 61, respectively. A voltage applied to bondpad 61 is transmitted to comb 43 and turns on the torsional drive to drive the mirror; likewise to bondpad 60 and comb 45. The torsion beam hinges in FIGS. 5 and 6 are shown to be straight, but in preferred embodiment, they are folded to become more compact.

Figure 7C:
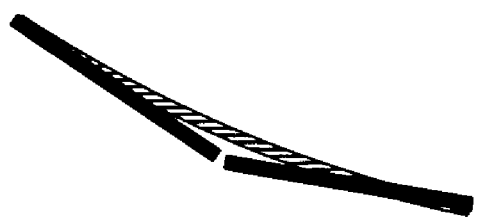
FIG. 7c is using one film a tensile film that bends only one way. This depicts a single stress embodiment of the present invention.

In another embodiment, the number of torsional drivers per axis can be reduced to one if the mirror only needed to be tilt in one direction. In this embodiment, thin films with internal stress are deposited on selected runs of the folded beam hinge so that they bend in concert to tilt the mirror. The stress is very common in metal films deposited by sputtering or evaporation. FIG. 7a shows films that are under compressive or tensile stress are deposited on selected beams, resulting in a bending pattern shown in FIG. 7b. FIG. 7a shows two films having compressive and tensile stress, respectively, are deposited on alternating run segments of a meandering torsion beam, resulting in a bending pattern shown in FIG. 7b. A single film having either compressive or tensile stress can be used also to achieve similar result as shown in FIG. 7c. The bending of the beams causes a payload plate that is supported with this hinge to turn when it is released, due to removal of sacrificial layer.

Figure 8A:
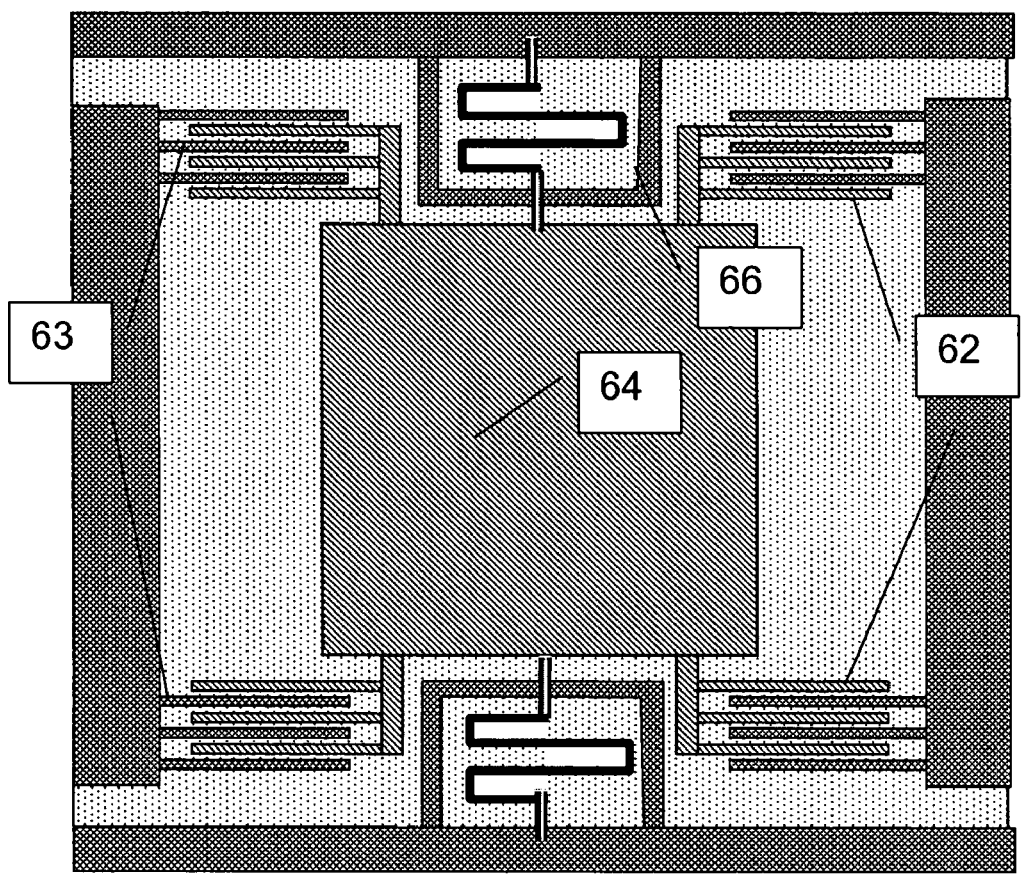
FIG. 8a is top schematic view of a micromachined single-axis optical switch according to the second embodiment of the present invention.

Another advantage of using this embodiment is that there is a larger capacitance due to the potentially longer combs that can be used as shown in FIG. 8a. This gives rise to greater torque.

Figure 8B:
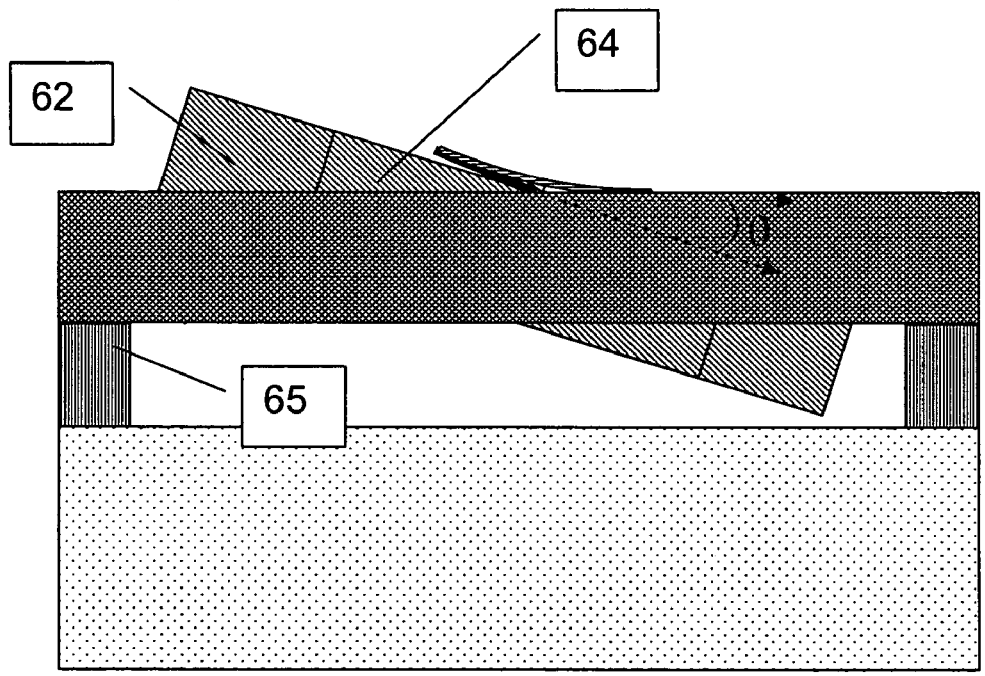
Figure 9:
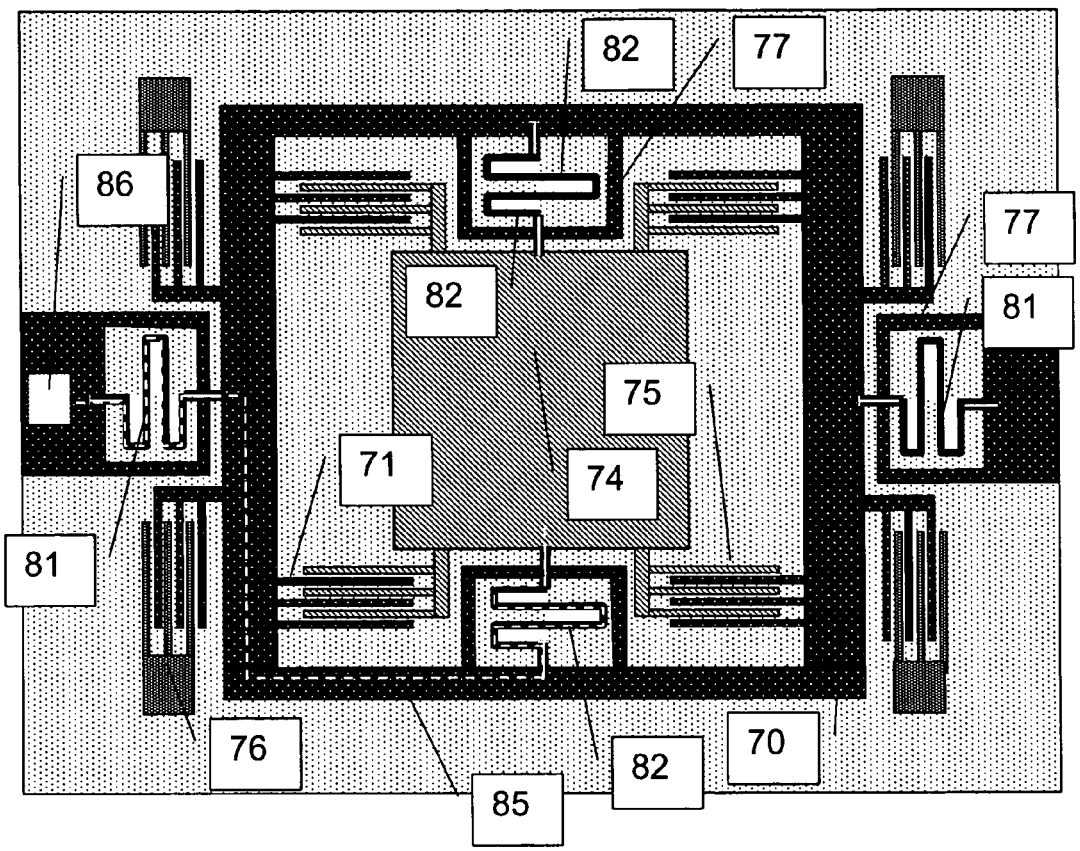
FIG. 9 is top schematic view of a micromachined dual-axis optical switch according to the second embodiment of the present invention.
Figure 9A:
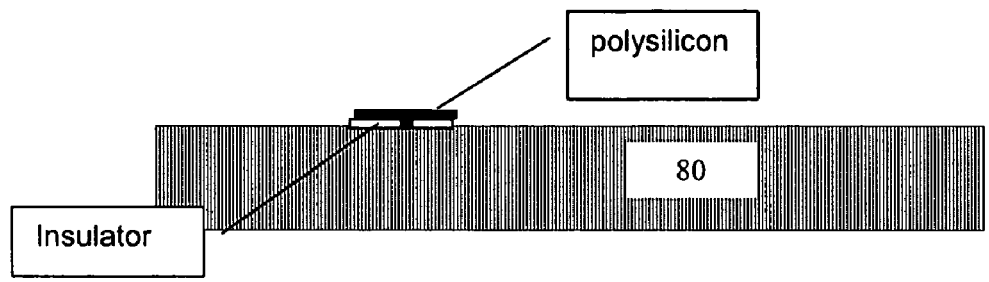
FIG. 9a–9f are cross-sectional views of the various stages of production of the optical switch of FIG. 9.
Figure 9B:
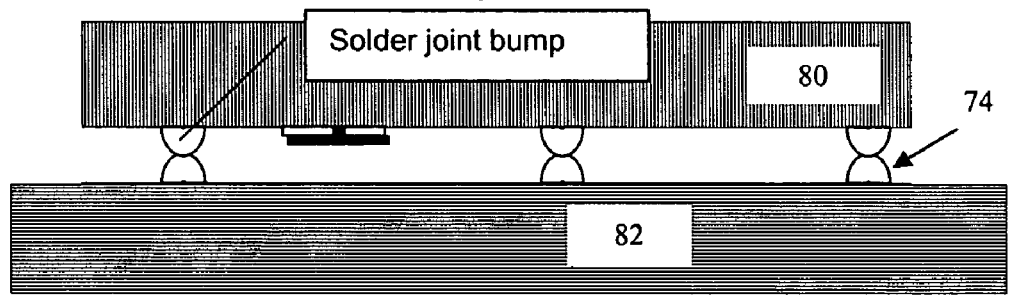
Figure 9C:
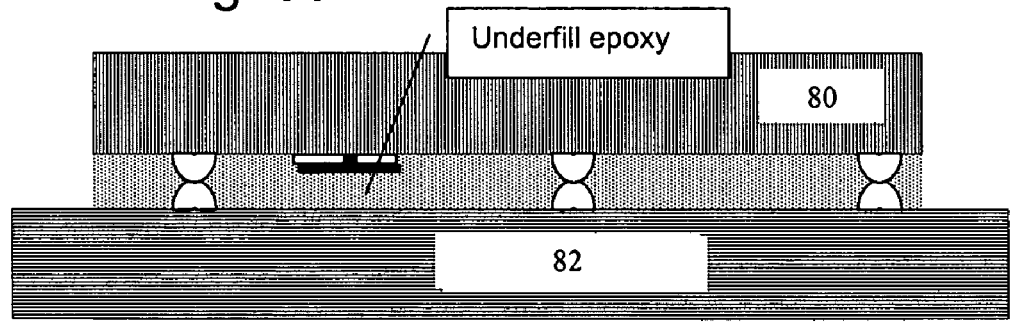
Figure 9D:
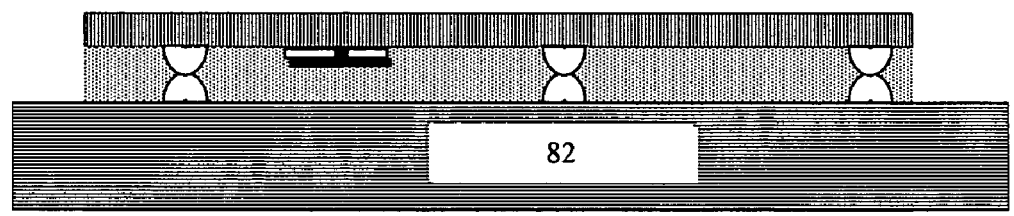
Figure 9E:
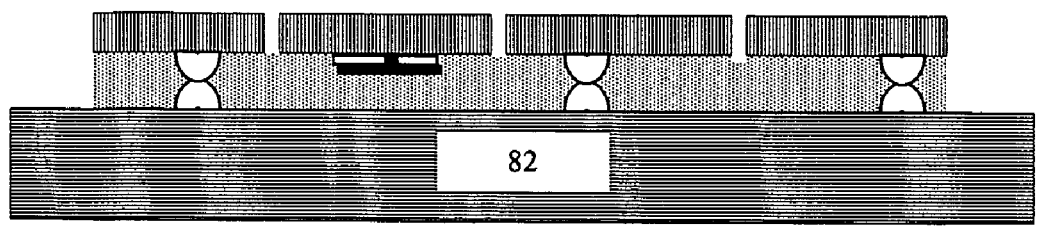
Figure 9F:
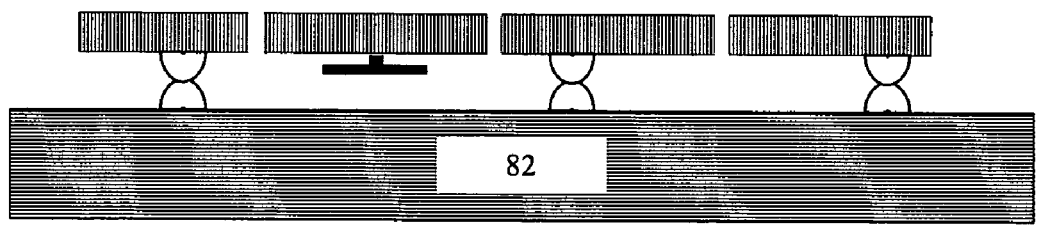

FIG. 8a is top view of the torsional drive that employs this stressed hinge. The movable combs 62 are offset by an angle q from the fixed combs 63 due to tilting of central payload plate 64, where the movable combs are attached, from stress bending, whose side view is shown in FIG. 8b. The folded beam hinges are often very flexible, a support is needed to keep them from sagging. Small support frames 66 are formed underneath said folded beam hinges can be formed to serve this purpose. A voltage applied between the movable comb and the fixed comb decreases the offset angle thus tilts the central payload plate. The amount of tilt, as determined in part by the thickness of the spacer 65 can be large without affecting the amount of electrostatic force. Thus low drive voltage, low power driver that is compatible with CMOS can be integrated with MEMS, i.e. the torsional drive that can be used in optical switches. Again the capacitance in the torsonal drive can be monitored in real time and used as feedback for closed-loop control for precise control of the tilting. A preferred embodiment of a 3-D optical switch comprising mirror with two tilting axes is shown in FIG. 9, where the suspended frame 70 and inner fixed combs 71 attached thereto, along with the hinges are grounded and isolated from the central payload plate 74 and inner movable combs 75 attached thereto. Again, support frames 77 may be formed to keep the hinges from sagging.

Similar support frames can be used in the optical switch depicted in FIG. 6. Voltage applied on the outer fixed combs 76 results in reduction in the offset angle that is caused by the stressed hinges 81. Voltage applied on the inner movable combs 75, which is attached to the central payload plate 74, reduces the offset angle of the central payload plate 74 caused by the stressed hinges 82, which are electrically insulated from central payload plate 74. An insulating layer is deposited on hinges 81 and 82, suspended frame 70, and support frames 77, so that a metal interconnect line 85 can be deposited and formed to electrically connect the central payload plate 74 and inner combs 75 with bondpad 86 without shorting to the grounded suspended frame 70. Voltage applied on the inner combs is from that applied on bondpad 86.

A method described below can be used to fabricate the above MEMS structures of preferred embodiments. It comprises the following steps: (a) Thin film (polysilicon, SiO2 and metal) deposition and formation of hinges and interconnect on a doped silicon wafer 80. This will forms the basis for the mechanical structure of the MEMS device. (b) Flip chip bump bonding is used to bond the wafer 80 upside down to a substrate wafer 82, which may contain CMOS integrated circuits, this may include a reflow of the bumps to form a joint as is standard practice in bump bonding; (c) Liquid epoxy or wax 74 is used to fill the void between the two bump bonded wafers and is cured, this provides a backing for subsequent thinning process; (d) The backside of the mounted top wafer, is thinned by grinding and polishing to the desired thickness; (e) The top wafer is patterned and etched with a deep silicon trench etch, that is capable of high aspect ratios; (f) Etch remove the underfilled epoxy to release the top wafer to form the suspended structures.

The embodiments and examples set forth herein are presented in order to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A torsional drive, comprising:
a payload plate,
a suspended frame, inner fixed combs,
outer fixed combs,
inner torsion beams and out torsion beams; and inner movable combs and outer movable combs and posts, wherein said inner movable combs that are attached to said payload plate, are hinged on said suspended frame with torsion beams from near the surface of said inner movable combs, and interdigit with said inner fixed combs slightly, and inner fixed combs and outer movable combs are fixed to said suspended frame, wherein said suspended frame, said inner fixed combs, said outer torsion beams, said outer movable comb, and said posts are electrically grounded and a layer of insulator is deposited thereon.

2. The torsional drive of claim 1 wherein said inner torsion beams are electrically insulated from said suspended frame and said payload plate.

3. The torsional drive of claim 2 wherein said outer hinges are connected to inner movable combs and thin metal lines make electrical connections between the inner movable combs and bond pads on said posts.

* * * * *